United States Patent [19]

Kusano et al.

[11] Patent Number: 5,519,431
[45] Date of Patent: May 21, 1996

[54] DRIVING CIRCUIT FOR SEMICONDUCTOR LASER AND IMAGE FORMING APPARATUS USING THE SAME

[75] Inventors: Akihisa Kusano, Kitsuki; Izumi Narita, Koganei; Yuzo Seino, Kawasaki; Kaoru Sato, Yokohama; Tatsuto Tachibana, Kawasaki; Tomohiro Nakamori, Ichikawa, all of Japan

[73] Assignee: Canon Kabushiki Kaisha, Tokyo, Japan

[21] Appl. No.: 125,229

[22] Filed: Sep. 23, 1993

[30] Foreign Application Priority Data

Sep. 24, 1992 [JP] Japan .................................. 4-254287
Aug. 20, 1993 [JP] Japan .................................. 5-206593

[51] Int. Cl.$^6$ .................................................. H04N 1/21
[52] U.S. Cl. .................................................. 347/247
[58] Field of Search .......................... 346/108, 107 R, 346/76 L, 160; 347/247, 237, 132; 355/40, 203

[56] References Cited

U.S. PATENT DOCUMENTS

| | | | |
|---|---|---|---|
| 5,115,147 | 5/1992 | Kusano et al. | 307/311 |
| 5,162,917 | 11/1992 | Sugishima | 358/296 |
| 5,361,156 | 11/1994 | Ridgeon | 359/161 |
| 5,373,518 | 12/1994 | Uchiyama et al. | 372/38 |

*Primary Examiner*—Mark J. Reinhart
*Attorney, Agent, or Firm*—Fitzpatrick, Cella, Harper & Scinto

[57] ABSTRACT

An apparatus for generating a laser beam modulated on the basis of an information signal, which comprises a circuit for generating a first information signal, a circuit for generating a second information signal, independent of the first information signal, a circuit for driving a semiconductor laser on the basis of the first and the second information signals, wherein the driving circuit comprises first and second switching elements which operate supplementarily with each other, one of the first and second switching elements switches a drive current to the semiconductor laser, and wherein the first information signal is provided into a control terminal of the first switching element and the second information signal is provided into a control terminal of the second switching element.

21 Claims, 10 Drawing Sheets

DRIVING CIRCUIT FOR SEMICONDUCTOR LASER AND IMAGE FORMING APPARATUS USING THE SAME

BACKGROUND OF THE INVENTION

FIELD OF THE INVENTION

The present invention relates for example to a laser beam printer which records by an electrophotographic process and relates to a driving circuit for a semiconductor laser that is used preferably therein.

DESCRIPTION OF THE RELATED ART

FIG. 4 shows the circuit arrangement of the control system a laser beam printer in the prior art. In the Figure, a reference numeral 1 denotes a sequence controller board which executes engine control such as image record timing control and rotation speed control of a polygon mirror. A reference numeral 2 denotes a video controller board which generates an image signal. A reference numeral 3 denotes a laser drive circuit board which turns on and off a laser diode. Furthermore, a reference numeral 4 indicates a central processing unit (CPU) which executes the engine control as a sequence controller. A reference numeral 5 indicates a laser diode driver, which turns on the laser diode when a LASER ON* signal is low level (hereinafter Low). A reference numeral 6 indicates the laser diode, a reference numeral 7 indicates an AND gate, and a reference numeral 8 indicates an inverter. A reference numeral 9 indicates an OR gate, a reference numeral 10 indicates a pin photo diode as a light receiving element, and A reference numeral 11 indicates a BD output circuit which receives an output of the pin photo diode 10 to generate a BD signal as a synchronous signal.

Before describing the operation of the above circuits, the structure of the laser beam printer will be briefly described with reference to FIG. 5. First, in FIG. 5, a reference numeral 12 indicates a polygon mirror for scanning a laser beam, a reference numeral 13 indicates an optical lens for focusing the laser beam on the surface of a drum, a reference numeral 14 is a reflection mirror for generating the synchronous signal, a reference numeral 16 indicates a photosensitive drum which receives the laser beam to form a latent image.

The image formation operation on the photosensitive drum 16 will now be described with reference to the timing chart in FIG. 6. First, the CPU 4 sets a UBL signal to high level (hereinafter High) in order to detect the BD signal which is a horizontal synchronous signal for image recording. The LASER ON* signal, which is an input signal of the laser drive circuit 5, goes Low, and the laser is emitted. When the laser beam is scanned by the polygon mirror 12 and conducted to the pin photo diode 10 by the reflection mirror 14, the BD signal is outputted from the BD output circuit 11 to the CPU 4. A timer of the CPU 4 is reset to a measuring time t=0 at the time the BD signal is inputted. Furthermore, at the same time the BD is inputted, the CPU 4 sends a BDOUT signal, which is also a synchronous signal, to the video controller 2. When a predetermined time UBLE passes since the input of the BD signal, the CPU 4 returns the UBL signal to Low to stop the laser emitting.

After the elapse of a time MSKE from the BD input, the CPU 4 sets a MSK signal Low to reset the mask of the image signal. The MSK signal prevents the photosensitive drum 16 of the area, which is out of the area to be transferred to a paper, from being exposed to the laser, and prevents the inside of the unit from being stained by the toner. If the MSK is High, even when the image signal is sent from the video controller, it is masked by the OR gate 9 and does not reach the laser drive circuit board 3. The video controller board 2 outputs an image signal after the predetermined time from the BDOUT signal. Then, the LASER ON* signal varies according to a VDO* signal which is the image signal, and the laser is turned on and off. At a timing at which the scanned laser beam exceeds the area of the paper (after the elapse of a time MSKS from BD), the CPU 4 again sets the MSK signal to High. Then, in a non-development area of the drum 16, the CPU 4 sets the UBL signal to High to emit the laser. Through the above process, a latent image is formed on the photosensitive drum 16. Other than the above, the CPU 4 controls the ordinary electrophotographic process, which is known and the description thereof is omitted.

However, the above-described device in the prior art has involved the following problems since gates 7 to 9 are disposed on the sequence controller board 1.

The image signal transmission path is complex since the path includes the cable between the video controller board 2 and the sequence controller board 1, the internal pattern of the sequence controller board 1, the cable between the sequence controller board 1 and the laser drive circuit board 3, and the internal pattern of the laser drive circuit board. Therefore, there has been a problem in that, as the image signal becomes higher in speed, the transmission lines which need to match with each other the tend to increase, so that the cost increases and a wave form deformation and perturbation of duty tend to occur. This problem considerably impairs the image quality of the laser beam printer, and is thus a deadly defect.

Namely, means for controlling to make the laser not emit in order to prevent from forming the latent image to the non-image area, even if the image signal is inputted from the video controller for generating the image signal to the laser drive circuit (hereinafter mask means) and means for enforcing the laser to fire in order to obtain the horizontal synchronous signal (hereinafter BD signal) of the image are arranged in a transmission line of image between the video controller and the laser drive circuit. Therefore the transmission line is complicated, so that it is not possible to transmit the signal stably and duty of the image signal is varied.

Thus, as described in U.S. Ser. No. 724,813 now U.S. Pat. No. 5,373,518 (filed on Jul. 2, 1991), the method wherein a logic circuit is arranged in the laser drive circuit so as to turn into a possibility to output directly the image signal from the video controller to the laser drive circuit is considered to use.

However, in the laser beam printer in which resolution capability is now being developed, transmission speed of the image signal become higher in geometrical progression, so that it is difficult to prevent from the disturbance of the wave form of the image signal only by using the above method.

Furthermore, in the laser drive circuit of the laser beam printer, in which a differential amplifier is used as a switching circuit for a laser current, a voltage of a transistor which forms the differential amplifier with a transistor which inputs the image signal is held constantly to determine a voltage slice level which is a threshold for switching the laser current by the image signal.

SUMMARY OF THE INVENTION

An object of the present invention is to improve the characteristics of a laser beam printer.

More specifically, another object is to stabilize the signal transmission of the image signal.

Yet another object is to solve above problems.

A still further object is to provide a driving circuit for semiconductor laser for modulating accurately the semiconductor at a high speed.

Yet another object is to prevent from inferiority of modulation precision even if the semiconductor laser is modulated according to a plurality of information signals.

According to the invention, there is provided an image forming apparatus comprising: means for generating an image signal; means for forming an image on the basis of the image signal; means for controlling the image forming means; means for transmitting the image signal from the image signal generating means to the image forming means without intervention of the controlling means; and means for impedance-matching with an impedance provided by the transmitting means.

According to the invention, there is provided an apparatus for generating a laser beam modulated on the basis of an information signal, comprising: means for generating a first information signal; means for generating a second information signal independent of the first information signal; means for driving a semiconductor laser on the basis of the first and the second information signals, wherein the driving means comprises first and second switching elements which operate supplementarily with each other, one of the first and second switching elements switches a drive current to the semiconductor laser, and wherein the first information signal is provided into a control terminal of the first switching element and the second information signal is provided into a control terminal of the second switching element.

There is provided a driving circuit for a semiconductor laser comprising:

a first input terminal for inputting a first information signal;

a second input terminal for inputting a second information signal; and first and second switching elements which operate supplementarily where one of the first and second switching elements switches a drive current of the semiconductor laser, wherein the first information signal is provided to a control terminal of the first switching element and the second information signal is provided to a control terminal of the second switching element.

According to the invention, there is provided a laser beam printer for forming an image using an electrophotographic process in which a laser output of a laser diode being turned on and off according to an image signal scans by a polygon mirror on a photosensitive body, wherein a switching circuit for turning on and off the laser diode comprises a differential amplifier circuit using a transistor pair, a base potential of at least one of the transistor pair is made variable to execute masking and/or forced light emission to the image signal.

According to the present invention, the base potential of the transistor in the differential amplifier circuit used as a switching circuit is made variable, and the slice voltage level of laser current switching to the image signal is varied to control masking or forced operation or both of the lasers in the differential amplifier circuit.

As described above, the base potential of the transistor pair in the differential amplifier circuit used as a laser current switching circuit is varied to vary the slice voltage level of laser current switching to the image signal. This can be achieved by the differential amplifier circuit by executing masking or forced operation or both of the lasers. This eliminates the need for a dedicated masking circuit or forced operation circuit and thus enables simple arrangement of the image signal transmission line, and stable signal transmission with a reduced duty change.

In addition, the base potentials of both transistors of the transistor pair are made variable, thereby enabling masking and forced laser emission.

Furthermore, since the image signal is invalidated by the masking signal or the forced operation signal, the arrangement of the invalidation circuit is simplified.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Preferred embodiments of the present invention will now be described in detail with reference to the drawings.

(First Embodiment)

Figure 1:
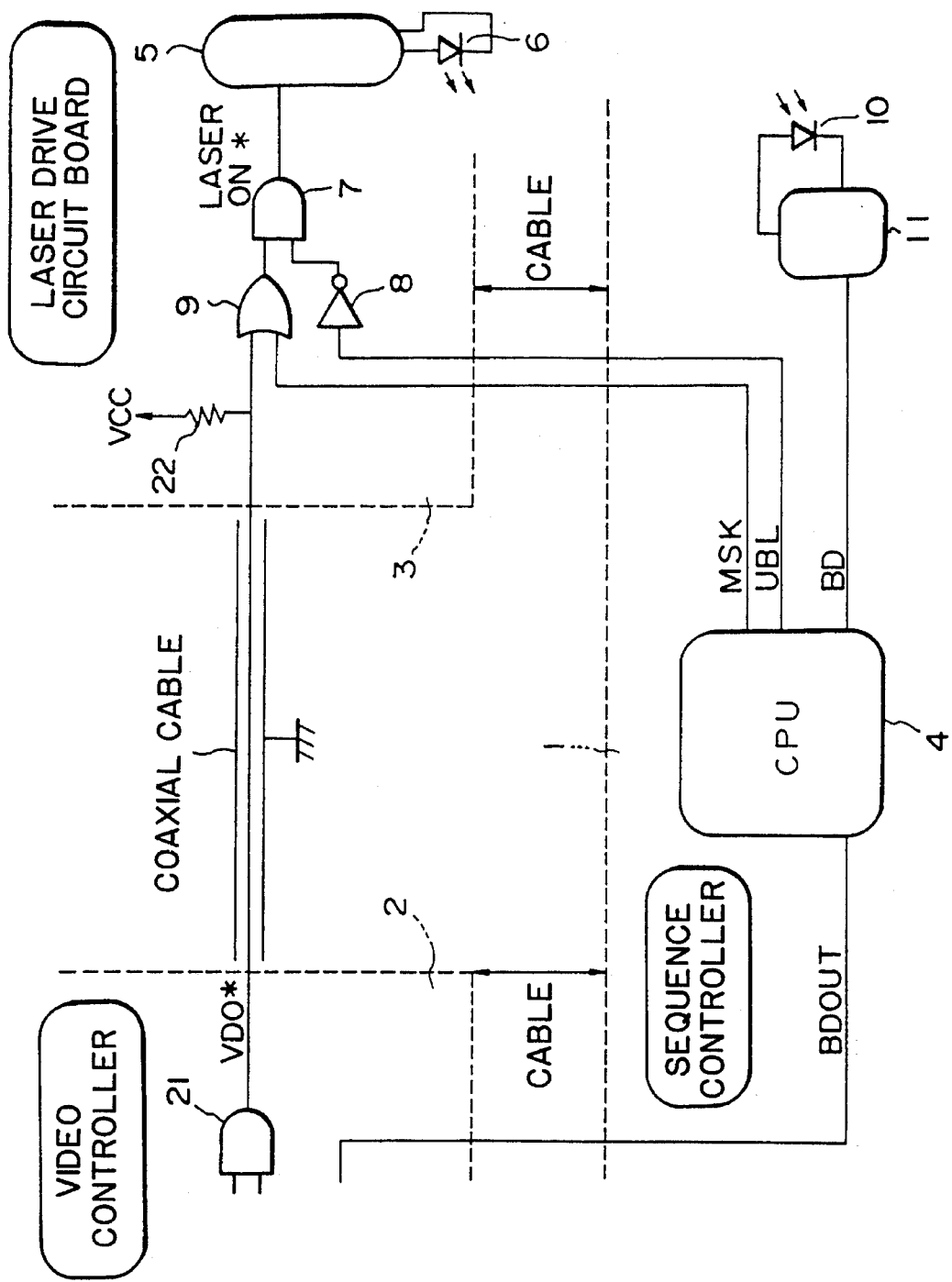
FIG. 1 is a schematic diagram showing an arrangement of a circuit and a circuit board structure of the first embodiment of the present invention.
Figure 4:
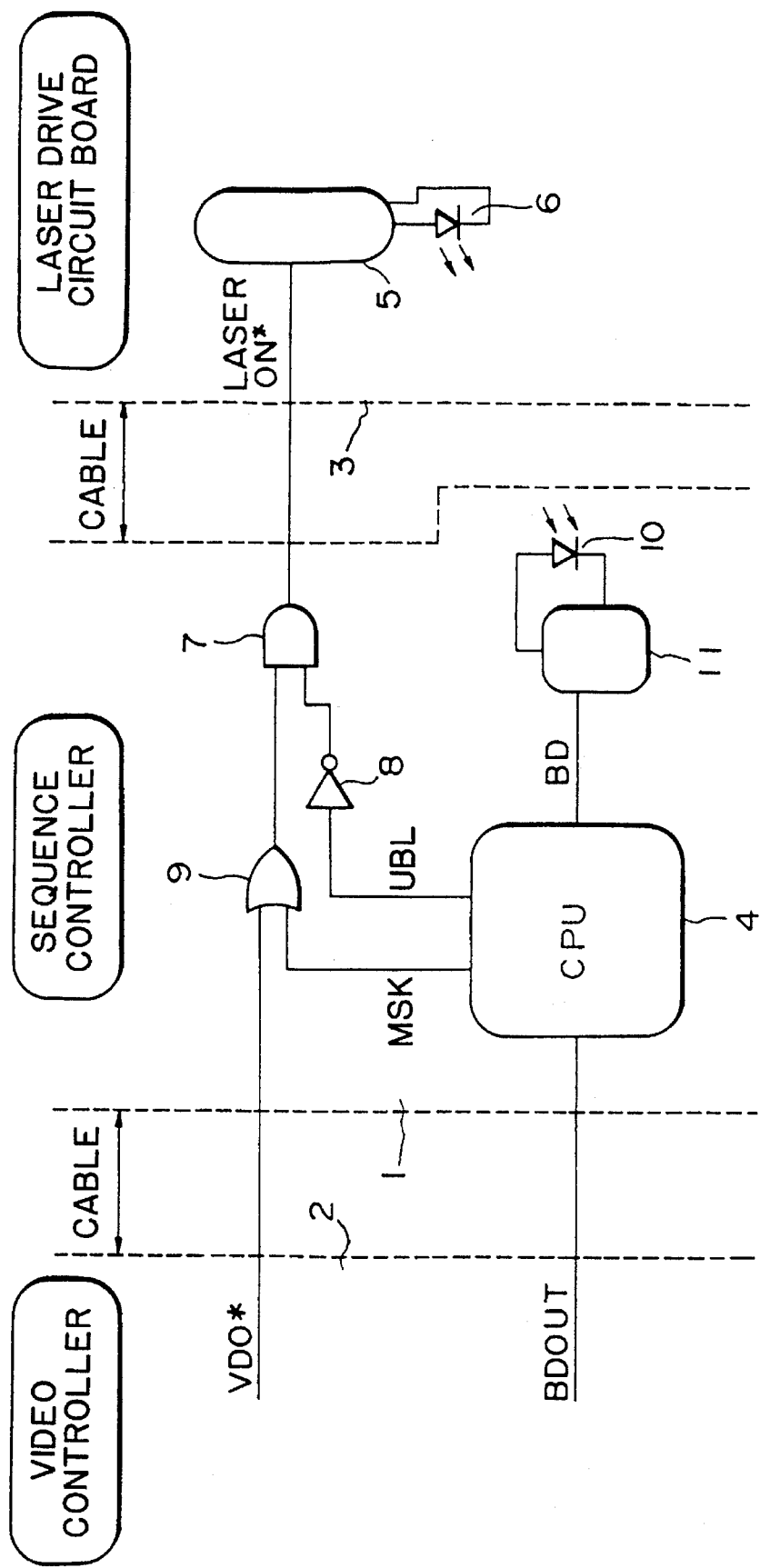
FIG. 4 is a schematic diagram showing a circuit arrangement and its circuit board structure of the prior art.
Figure 5:
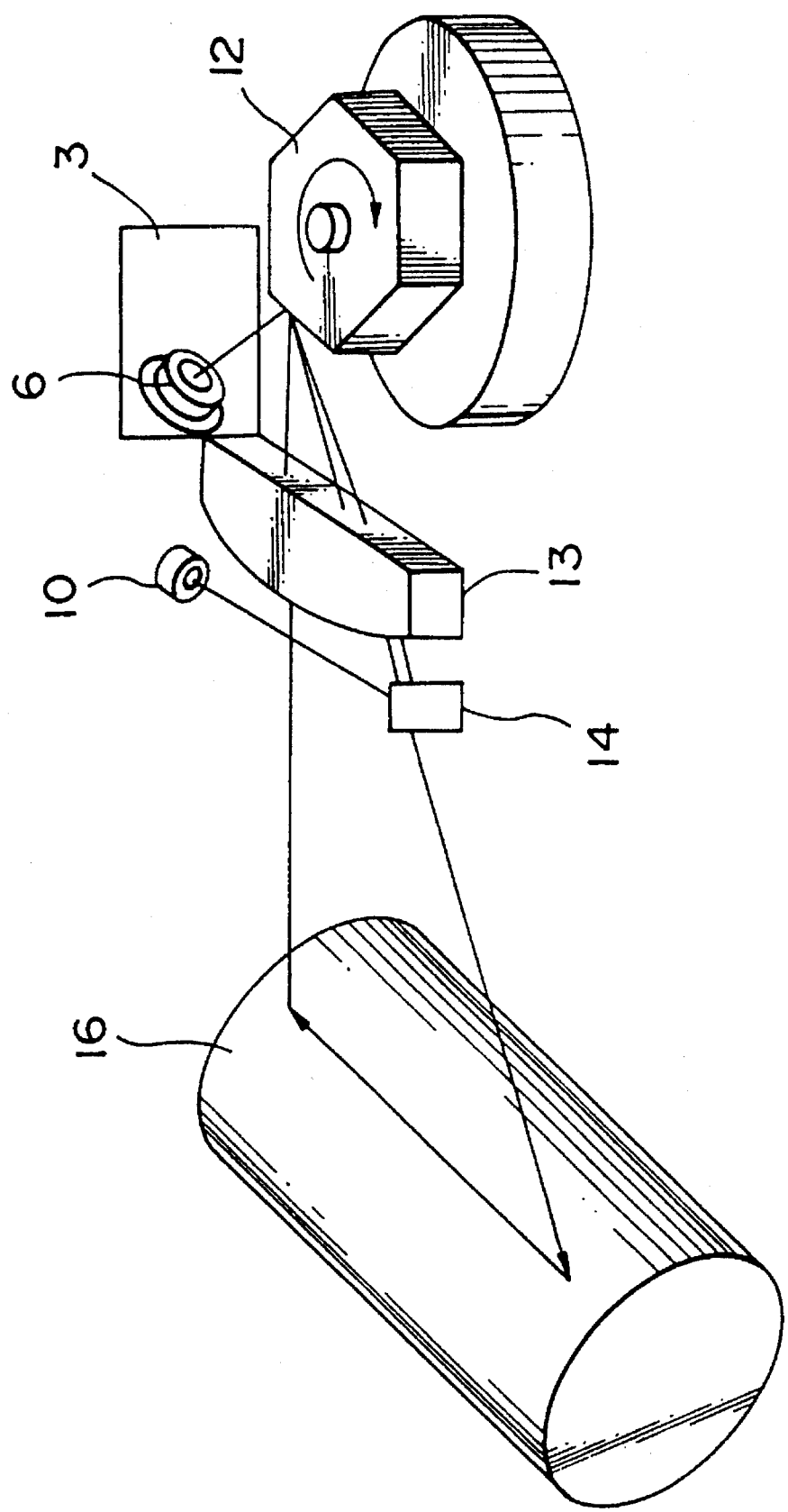
FIG. 5 is a schematic perspective diagram showing a brief structure of a laser beam printer.
Figure 6:
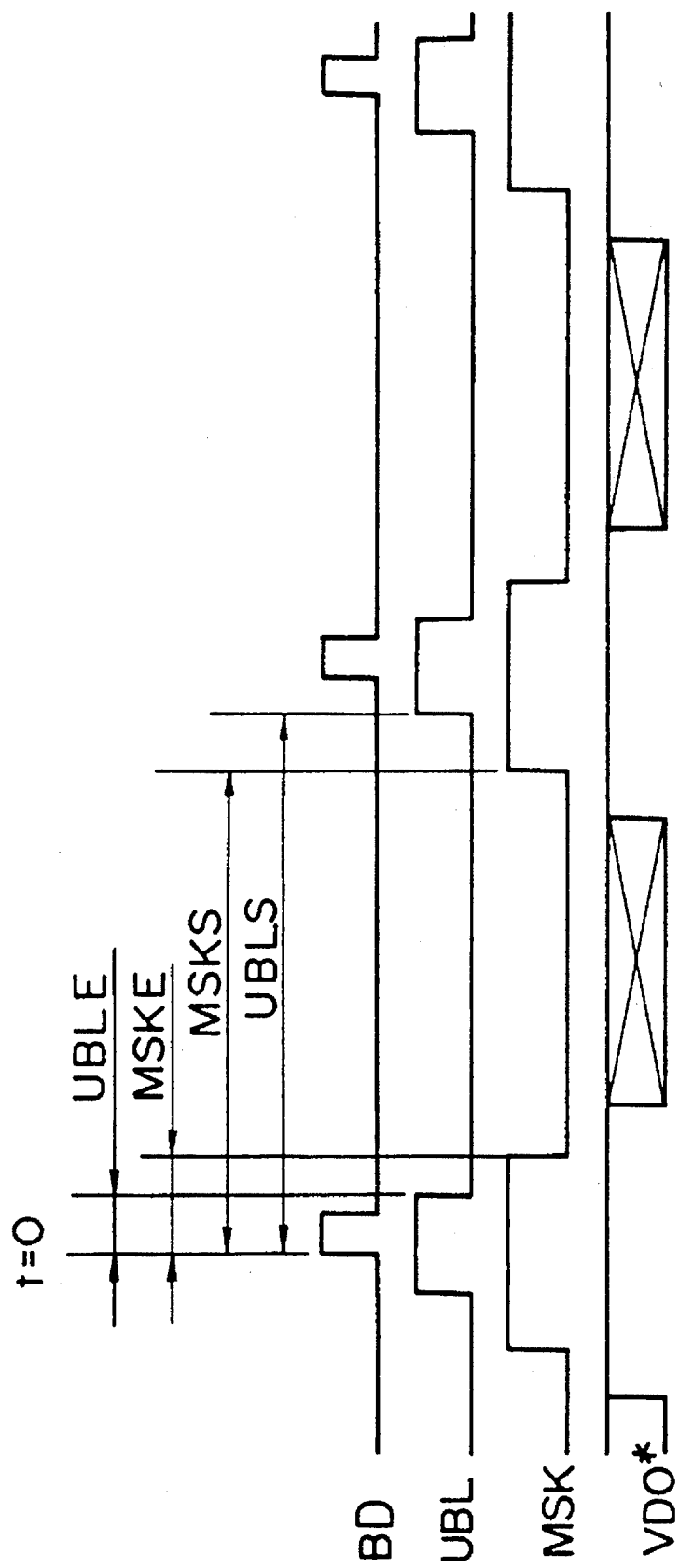
FIG. 6 is a waveform diagram showing generation timing of various signals.

FIG. 1 shows the circuit layout of the first embodiment of the present invention. Similar portions to those in the prior art example shown in FIG. 4 are indicated by similar reference numbers, and detailed description thereof is omitted. In FIG. 1, a reference numeral 21 indicates a driver IC. A reference numeral 22 indicates a resistor for pulling up the voltage of the VDO* signal line to the voltage of the power supply. In the present embodiment, the video controller board 2 and the laser drive board 3 are connected by a coaxial cable, and the resistance of the resistor 22 is equal to the impedance of the coaxial cable.

As can be seen from FIG. 1, in the present embodiment, the gates 7 to 9 which have been on the sequence controller board in the prior art are located on the laser drive circuit board 3. Furthermore, the image signal is connected directly from the video controller board 2 to the laser drive circuit board 3, not through the sequence controller board.

The video controller board 2 is connected to the laser drive circuit board 3 with a 50-ohm coaxial cable. It is pulled up by 50 ohms at the laser drive circuit board 3 side. Since the driver 21 on the video controller board 2 can sufficiently drive the 50-ohm load, the image signal transmission line is matched in impedance, and high-quality signal transmission is possible. Therefore, the high-quality VDO* signal can be inputted to the laser drive circuit board, and the high-quality laser switching is possible by shortening the patterns in the laser board.

(Second embodiment)

Figure 2:
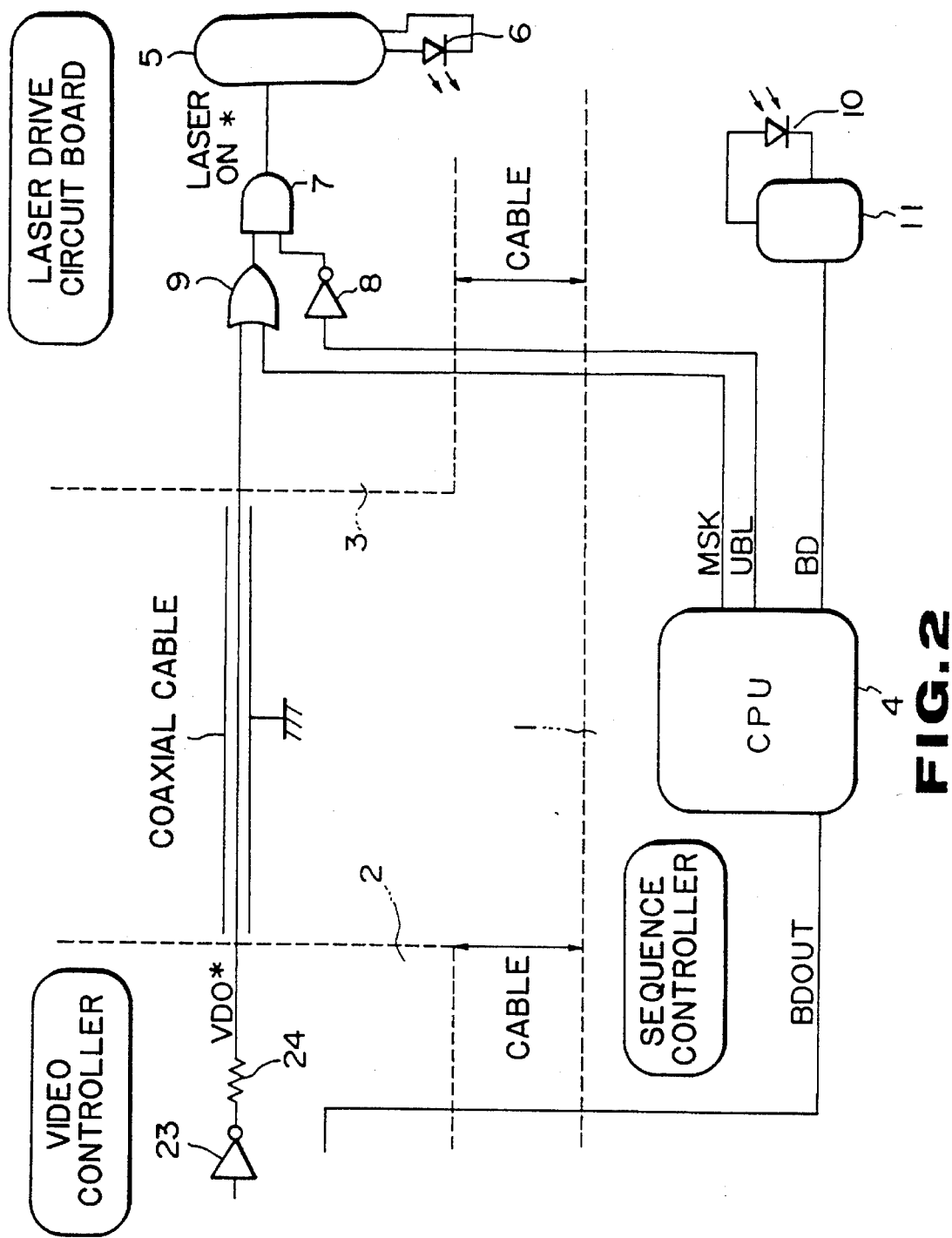
FIG. 2 is a schematic diagram showing another arrangement of the circuit and the circuit board structure as the second embodiment of the present invention.

A second embodiment is shown in FIG. 2. In FIG. 2, a reference numeral 23 indicates a high-speed TTL with a lower drive capacity such as AS04, a reference numeral 24 indicates a resistor having the same resistance as the impedance of the coaxial cable. This embodiment is characterized in that the impedance matching of the image signal transmission line is realized at the serial end. Since a good matching is obtained in the serial end even if the element at the transmission side has no capacity to drive the 50-ohm load, this system is preferably used for cases where reception elements are concentrated at the end of the transmission line. In general, the element with no drive capacity is inexpensive, therefore, this embodiment is inexpensive than the above first embodiment, with the same efficiency.

(Third embodiment)

Figure 3:
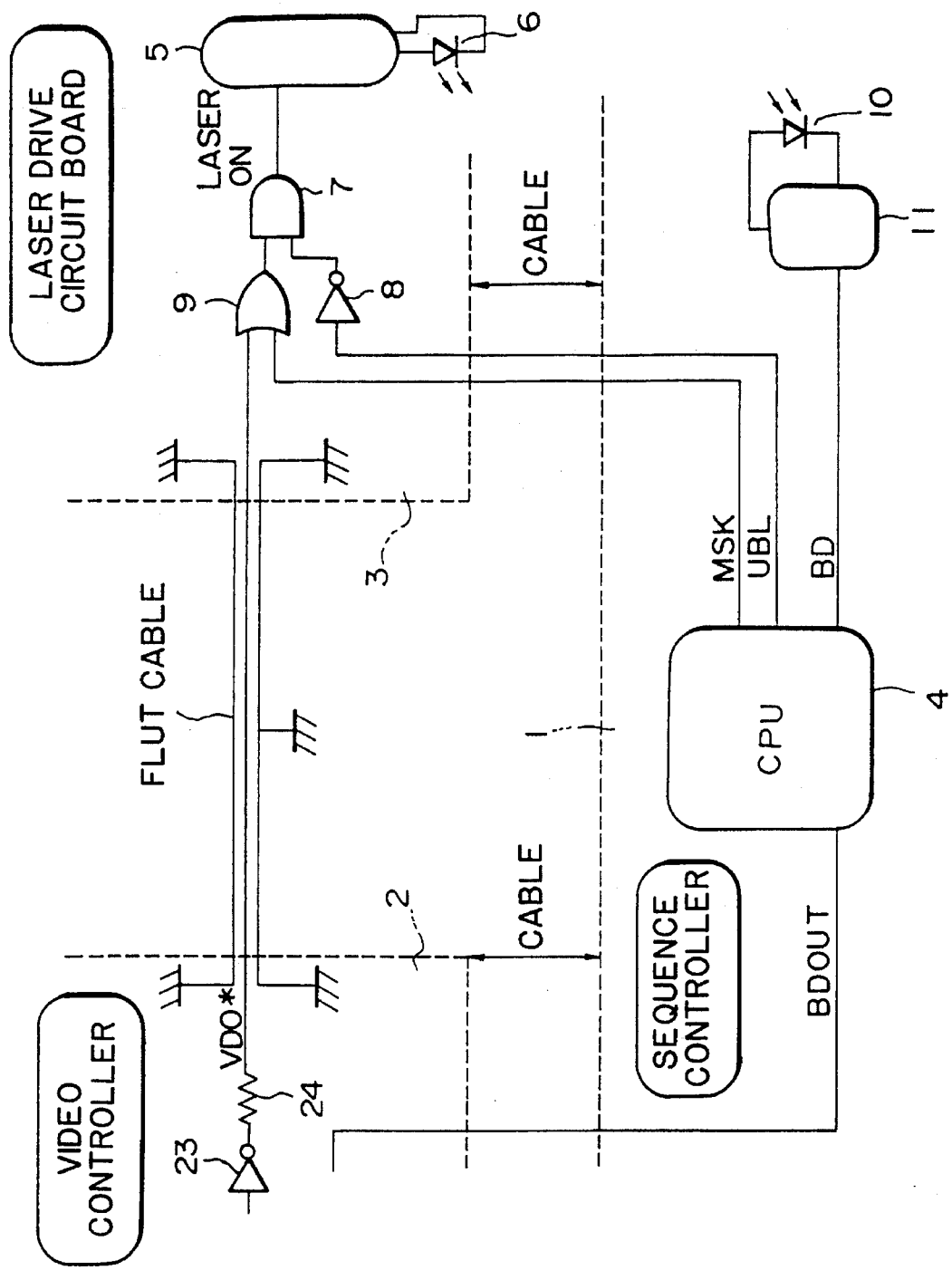
FIG. 3 is a schematic diagram showing a further circuit arrangement and its circuit board structure as the third embodiment of the present invention.

A third embodiment is shown in FIG. 3. This version differs from the second embodiment shown in FIG. 2 in that the video controller board 2 and the laser drive circuit board 3 are connected by a flat cable. In this embodiment, in order to realize stable transmission characteristics using the flat cable, signal lines at both sides of the VDO* signal transmission line on the flat cable is connected to GND to obtain a low impedance. This enables an impedance of about 80 ohms of the transmission line. Therefore, it is necessary to use the resistor 24 of about 80 ohms which was 50 ohms in the second embodiment of the FIG. 2. This embodiment is slightly inferior in the stability of the transmission line to the coaxial cable, but almost satisfactory impedance matching is obtained at a low cost by using a flat cable.

In the above embodiments, the logic circuits 7 to 9 are located on the laser drive circuit board 3, but also can be located in the driver 5. Furthermore, the laser drive circuit in the fourth or fifth embodiment described later is preferable in use.

(Fourth Embodiment)

Figure 7:
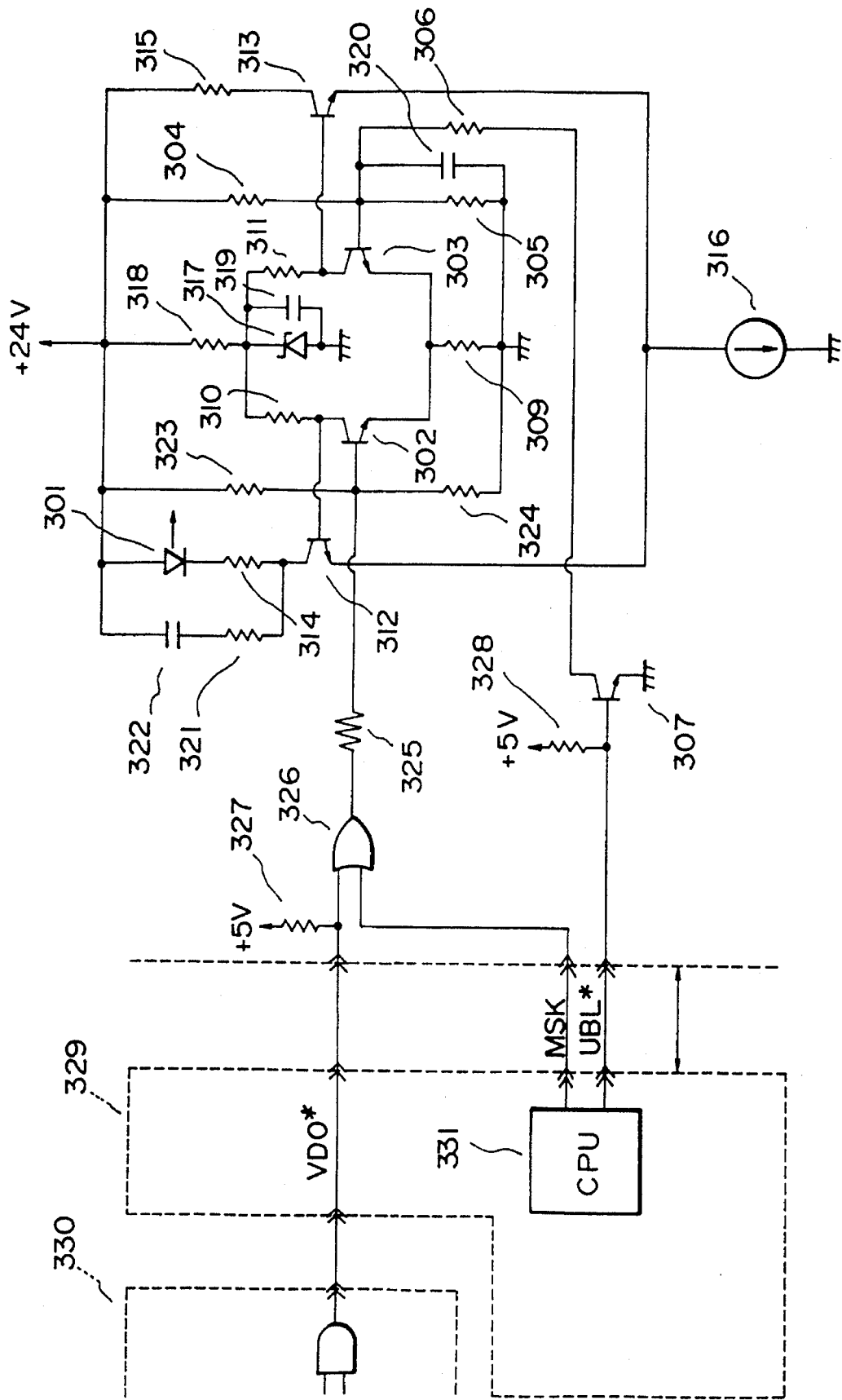
FIG. 7 is a circuit diagram showing an arrangement of a laser drive circuit in the fourth embodiment.

FIG. 7 shows the arrangement of the laser drive circuit IC of the present embodiment. In FIG. 7, a reference numeral 301 indicates a semiconductor laser which functions as exposure means in the electrophotographic process. Reference numerals 302 and 303 indicate a pair of transistors, and a differential amplifier circuit is composed of the transistor pair and resistors 309, 310, 311, and 318. The base of the transistor 303 is connected with resistors 304, 305, and 306. Of these resistors, the resistor 306 is connected to the collector of a transistor 307.

A capacitor 320 is a bypass capacitor. When the transistor 307 is off, the base potential of the transistor 303 is a value in which +24 V of the power supply is divided by the resistors 304 and 305. When the transistor 307 is on, the resistors 305 and 306 are connected parallel, and the base potential is a lower value than that when the transistor 307 is off. When the base potential of the transistor 302 is higher than the base potential of the transistor 303, the transistor 302 is on, and the transistor 303 is off. Then, the base potential of the transistor 312 becomes lower than the base potential of the transistor 313, the transistor 312 is off, and the transistor 313 is on.

Current from a constant current supply 316 does not flow to the semiconductor laser 301 because the transistor 312 is off, and the semiconductor laser 301 does not fire. On the contrary, when the base potential of the transistor 302 is lower than the base potential of the transistor 303, the laser 301 fires. A zener diode 317 is one which is to provide a base potential of the transistor 312 when it is on, or transistor 313, and a capacitor 319 is a bypass capacitor. A resistor 321 and a capacitor 322 form a snubber circuit for shaping the wave form of the current passing through the laser. Resistors 323, 324, and 325 are resistors for determining the voltage level of the image signal inputted to the transistor 302. A reference numeral 326 indicates an OR circuit located in the image signal transmission line for masking. When a mask signal (MSK) is High, the laser current does not flow with independence of High/Low of the image signal. Reference numerals 327 and 328 indicate pull-up resistors. The reference numeral 329 indicates a sequence controller for executing engine control including control over the laser drive circuit, a reference numeral 331 indicates a CPU as a heart of the above operation, a reference numeral 330 indicates a video controller for forming the image signal.

Figure 8:
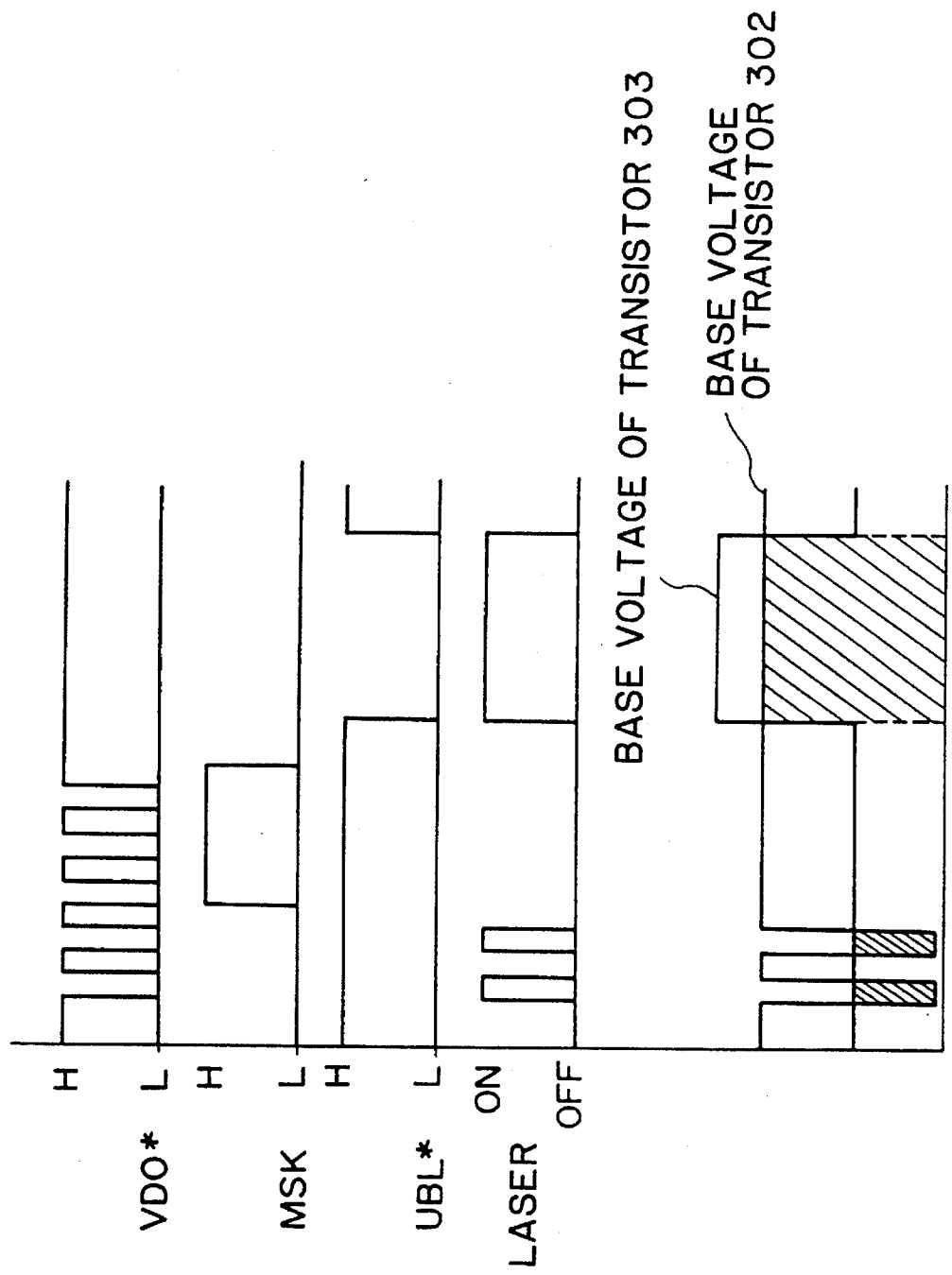
FIG. 8 is a timing chart showing signal generation timing of the circuit of FIG. 7.

FIG. 8 is a time chart showing the operation of the fourth embodiment.

It can be seen from FIG. 8 that the base potential of the transistor 303 is variably set according to a forced light emission signal (UBL) to forcibly operate the laser to fire, and the laser firing is inhibited according to the mask signal (MSK).

As described above, by making the base potential of the transistor variable in the laser drive circuit, which switches the laser current according to the image signal, using the differential amplifier circuit with the transistor pair and by making the slice voltage level to the image signal for the laser current switching variable to emit a laser forcibly, so that a dedicated laser forced light emission circuit can be eliminated. As a result, the arrangement of the image signal transmission line is simplified, and stable signal transmission with reduced duty variation is possible.

(Fifth embodiment)

Figure 9:
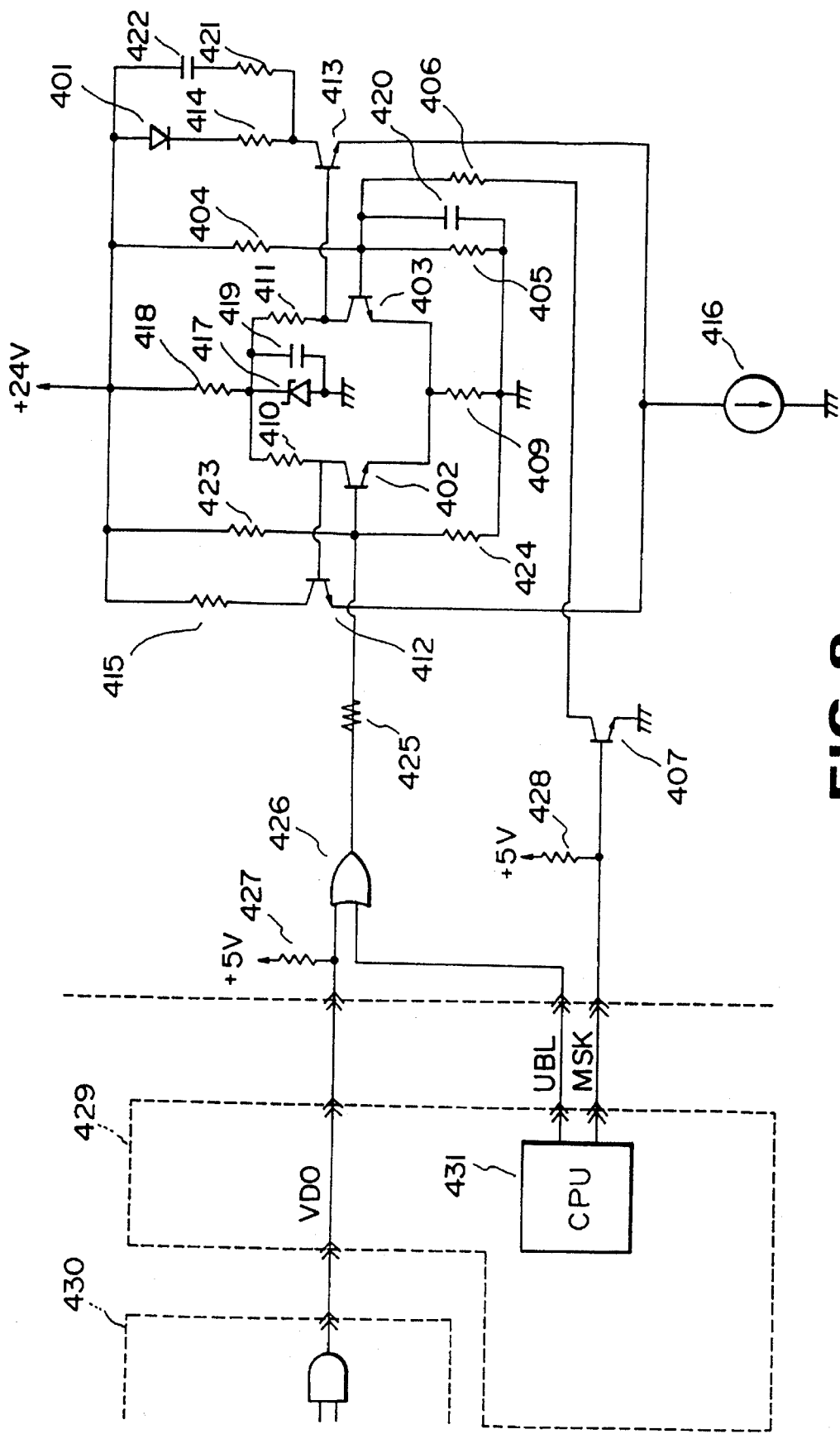
FIG. 9 is a circuit diagram showing an arrangement of another laser drive circuit in the fifth embodiment.

Another circuit arrangement of a fifth embodiment is shown in FIG. 9. In FIG. 9, a reference numeral 401 indicates a semiconductor laser functioning as exposure means of the electrophotographic process, reference numerals 402 and 403 indicate a transistor pair, and a differential amplifier circuit is composed of the transistor pair and resistors 409, 410, 411, and 418. The base of the transistor 402 is inputted with the image signal (VDO). The base of the transistor 403 is connected with resistors 404, 405, and 406 and, of these resistors, the resistor 406 is connected to the collector of the transistor 407.

A capacitor 420 is a bypass capacitor. When the transistor 407 is off, the base potential of the transistor 403 is a value in which +24 V of the power supply is divided by the resistors 404 and 405. When the transistor 407 is on, the resistors 405 and 406 are connected parallel, and the base potential is a lower value than that when the transistor 407 is off. When the base potential of the transistor 402 is higher than the base potential of the transistor 403, the transistor 402 is on, and the transistor 403 is off. Then, the base potential of the transistor 412 becomes lower than the base potential of the transistor 413, the transistor 412 is off, and the transistor 413 is on.

Current from a constant current supply 416 flows to the semiconductor laser 401 because the transistor 412 is on, and the semiconductor laser 401 fires. On the contrary, when the base potential of the transistor 402 is lower than the base potential of the transistor 403, the laser 401 does not emit. A zener diode 417 is one which is to provide the transistor 412 when it is on, or transistor 413 with a base potential and a capacitor 419 is a bypass capacitor. A resistor 421 and a capacitor 422 form a snubber circuit for shaping the wave form of the current passing through the laser. Resistors 423, 424, and 425 are resistors for determining the voltage level of the image signal inputted to the transistor 402. A reference numeral 426 indicates an OR circuit located in the image signal transmission line for masking. When the forced light emission signal (UBL) is High, the laser current flows with independence of High/Low of the image signal. Reference numerals 427 and 428 indicate pull-up resistors. A reference numeral 429 indicates a sequence controller for executing engine control including control over the laser drive circuit, a reference numeral 431 indicates a CPU as a heart of the above operation, the reference numeral 430 indicates a video controller for forming the image signal.

Figure 10:
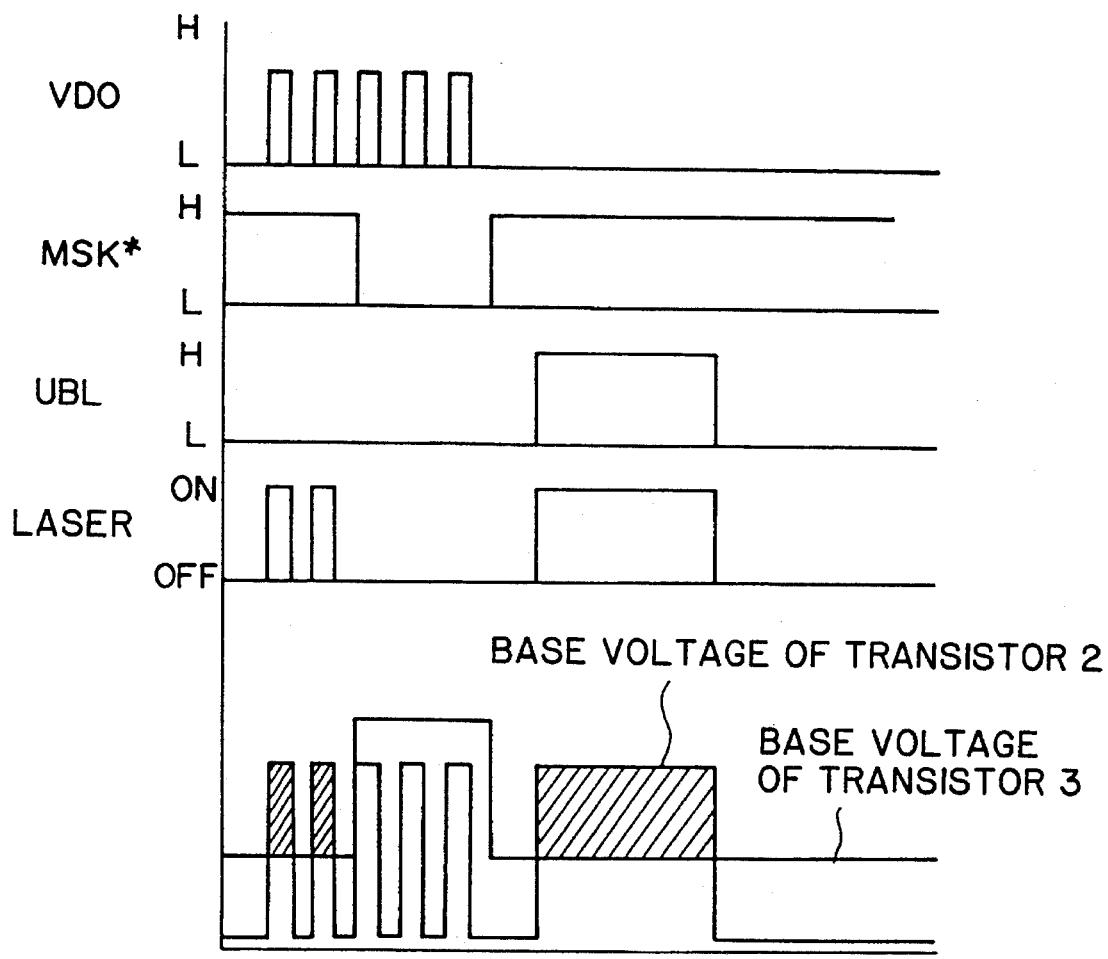
FIG. 10 is a timing chart showing signal generation timing of the circuit of FIG. 8.

Relation between the changes in the base potentials of the transistor 402 and transistor 403, and the on/off operation of the laser is shown in FIG. 10. That the laser operation is controlled according to the mask signal (MSK*) and the forced light emission signal (UBL*) is the same as in FIG. 8. In the differential amplifier circuit in FIG. 7, the image signal (VDO*) is invalidated by the mask signal (MSK) in the OR circuit 326, whereas in the differential amplifier circuit in FIG. 9, the image signal (VDO) is invalidated by the forced light emission signal (UBL) in the OR circuit 426.

Furthermore, when the period for masking and the period for the forced light emission are duplicated, the CPU 431 sets the MSK* signal High while the UBL signal is High.

Still further, OR circuits 325, 426 can be arranged in the IC or out of the IC.

In addition, the image signals VDO, VDO* are connected with the laser drive circuit through the sequence controller board 329, 429, but these may be directly connected preferably.

The present invention has been described in detail with respect to preferred embodiments and it will now be that changes and modifications may be made without departing from the invention in its broader aspects, and it is the intention, therefore, in the appended claims to cover all such changes and modifications as fall within the true spirit of the invention.

What is claimed is:

1. An image forming apparatus comprising:

generating means for generating an image signal image forming means comprised by a semiconductor laser which generates a laser beam modulated on the basis of the image signal, for forming an image on the basis of the image signal;

controlling means for controlling said image forming means, wherein said controlling means outputs an image control signal to said image forming means and said image forming means forms the image on the basis of the image signal and the image control signal;

transmitting means for transmitting the image signal from said image signal generating means to said image forming means without intervention of said controlling means; and impedance-matching means for impedance-matching with an impedance provided by said transmitting means;

wherein said image control signal is a mask signal for stopping the laser emission of the semiconductor laser independently of said image signal.

2. An image forming apparatus as claimed in claim 1, wherein said image forming means comprises a semiconductor laser for generating a laser beam which is modulated on the basis of the image signal.

3. An image forming apparatus as claimed in claim 1, wherein said transmitting means comprises a coaxial cable.

4. An image forming apparatus as claimed in claim 1, wherein said impedance-matching means comprises a resistance.

5. An image forming apparatus as claimed in claim 1, wherein said image forming means further comprises a logic circuit for processing logically the image signal and the image control signal; and a semiconductor laser drive circuit for driving said semiconductor laser corresponding the processing result of said logic circuit.

6. An image forming apparatus as claimed in claim 1, wherein said image control signal is a forced light emission signal for making the semiconductor laser emit forcibly with independence from said image signal.

7. An image forming apparatus as claimed in claim 6, wherein said image forming means further comprises means for deflecting the laser beam generated by said semiconductor laser; and means for detecting the laser beam deflected by said deflecting means at a predetermined position so as to generate a horizontal synchronous signal; and wherein said controlling means outputs said forced light emission signal so as to detect the deflected laser beam at the specified position by said detecting means.

8. An apparatus for generating a laser beam emitted from a semiconductor laser and modulated in accordance with an information signal, comprising:

first generating means for generating a first information signal;

second generating means for generating a second information signal independent of the first information signal; and a differential amplifier having first and second terminals for switching a current supplied to said semiconductor laser in accordance with said first and second information signals, wherein said first information signal is supplied to the first terminal of said differential amplifier and said second information signal is supplied to the second terminal of said differential amplifier.

9. An apparatus as claimed in claim 8, wherein said differential amplifier comprises transistors whose bases correspond to said the first and second terminals, respectively.

10. An apparatus as claimed in claim 8, wherein said differential amplifier is in the form of an IC.

11. An apparatus as claimed in claim 8, wherein said second information signal is either one of a forced light emission signal for making said semiconductor laser emit independently of said first information signal, and a forced light stopping signal for stopping emission of said semiconductor laser independently of said first information signal.

12. An apparatus as claimed in claim 8, further comprising:

means for generating a third information signal; and processing means for processing logically said first and third information signals, whereby an output from said processing means is supplied to the first terminal of said differential amplifier.

13. An apparatus as claimed in claim 8, wherein said first information signal is an image signal and said second information is an image control signal.

14. An apparatus as claimed in claim 8, further comprising:

transmitting means for transmitting said first information signal from said first generating means to said differential amplifier without intervention of said second generating means.

15. An apparatus as claimed in claim 14, further comprising a resistor for matching with an impedance of said transmitting means.

16. An apparatus as claimed in claim 14, wherein said transmitting means comprises a coaxial cable.

17. An apparatus as claimed in claim 13, further comprising:

deflecting means for deflecting the laser beam generated by said semiconductor laser; and detecting means for detecting the laser beam deflected by said deflecting means at a predetermined position so as to generated a horizontal synchronous signal, wherein said second generating means outputs said forced light emission signal as said image control signal so said detecting means detects the deflected laser beam at said predetermined position.

18. A laser beam printer for forming an image using an electrophotographic process, comprising:

a laser diode which outputs a laser beam modulated according to an image signal;

a polygon mirror which scans the modulated laser beam onto a photosensitive body; and a switching circuit for turning on and off said laser diode so as to modulate the laser beam according to the image signal, wherein said switching circuit comprises a differential amplifier circuit using a transistor pair, a base potential of at least one of said transistor pair being made variable by varying means so as to execute masking and/or forced light emission to the image signal.

19. A laser beam printer as claimed in claim 18, wherein the base potential of one of said transistor pair is variable by first varying means for masking, and the base potential of the other transistor of said transistor pair is made variable by second varying means for forced light emission.

20. A laser beam printer as claimed in claim 18, further comprising means for inputting, to said differential amplifier circuit, a mask signal for instructing masking and a forced light emission signal for instructing forced light emission, and wherein said laser beam printer further comprises means for variably setting base voltages of said transistor pair according to said forced light emission signal.

21. A laser beam printer as claimed in claim 20, further comprising a circuit for blocking said image signal by said mask signal or said forced light emission signal.

* * * * *

UNITED STATES PATENT AND TRADEMARK OFFICE
CERTIFICATE OF CORRECTION

PATENT NO. : 5,519,431

DATED : May 21, 1996

INVENTOR(S) : Akihisa Kusano, et al.

It is certified that error appears in the above-identified patent and that said Letters Patent is hereby corrected as shown below:

```
        Column 1, line 16, change "system" to --system
of--; and
                 line 32, delete "A".

Column 2, line 27, delete "the".

Column 8, line 14, change "the" to --to the--;
                 line 48, delete "the"; and
                 line 67, change "information" to
--information signal--.

Column 9, line 18, change "generated" to
--generate--.
```

Signed and Sealed this

First Day of October, 1996

Attest:

BRUCE LEHMAN

*Attesting Officer*     *Commissioner of Patents and Trademarks*